(12) United States Patent
Vega et al.

(10) Patent No.: US 6,424,521 B1
(45) Date of Patent: Jul. 23, 2002

(54) ADJUSTABLE BRACKET FOR COMPUTER CARD SLOTS

(75) Inventors: Juan R. Vega, Round Rock; Joseph M. Giannuzzi, Cedar Park, both of TX (US)

(73) Assignee: Dell Products L.P., Round Rock, TX (US)

( * ) Notice: Subject to any disclaimer, the term of this patent is extended or adjusted under 35 U.S.C. 154(b) by 9 days.

(21) Appl. No.: 09/624,542

(22) Filed: Jul. 24, 2000

(51) Int. Cl.$^7$ ................................................ H05K 7/14
(52) U.S. Cl. ..................... 361/683; 361/748; 361/752; 361/800
(58) Field of Search ................................ 361/736, 737, 361/740, 741, 747, 748, 752, 753–756, 759, 767, 796–804, 391, 394; 174/35 C, 35 R; 24/293–295; 49/489.1, 492.1, 503; 364/708

(56) References Cited

U.S. PATENT DOCUMENTS

| | | | |
|---|---|---|---|
| 4,924,355 A | 5/1990 | Mitchell et al. | |
| 4,991,058 A | * 2/1991 | Witkins et al. | ............. 361/391 |
| 5,172,306 A | * 12/1992 | Cantrell | ..................... 361/415 |
| 5,174,789 A | * 12/1992 | Yu et al. | ..................... 439/607 |
| 5,317,483 A | 5/1994 | Swindler | |
| 5,544,006 A | 8/1996 | Radloff et al. | |
| 5,575,546 A | 11/1996 | Radloff | |
| 5,679,923 A | * 10/1997 | Le | ............................ 174/35 R |
| 5,781,414 A | 7/1998 | Mills et al. | |

* cited by examiner

Primary Examiner—Darren Schuberg
Assistant Examiner—Yean Hsi Chang
(74) Attorney, Agent, or Firm—Haynes and Boone, LLP (57) ABSTRACT

A variable size bracket is provided for use with a low profile card mounted in either a low profile computer chassis, or a standard profile computer chassis. The bracket is a multi-portion bracket adjustable between a first bracket size and a second bracket size. A first bracket portion is of the first bracket size and covers a first size opening. A low profile card is attached to the first bracket portion. A second bracket portion is attached to the first bracket portion for extending the bracket to the second bracket size to cover a second size opening, greater than the first size opening, and for reducing the multi-portion bracket to the first bracket size to cover the first size opening.

22 Claims, 7 Drawing Sheets

ADJUSTABLE BRACKET FOR COMPUTER CARD SLOTS

BACKGROUND

The disclosures herein relate generally to a computer and more particularly to a bracket for covering card slots in a computer chassis.

A computer chassis includes a rear wall or tailgate which is the input-output (I/O) wall of the chassis. At this location, several I/O plugs and connectors are located. Cards such as I/O cards, storage cards, graphics cards, communication cards, modem cards and network interface communication cards, are located in the chassis adjacent the tailgate. The cards are inserted top down and are plugged into connectors in the chassis. The cards also include an edge immediately adjacent the tailgate. The edges include a plug, and the tailgate includes a slot for accessing the plug of each card.

A bracket is used to cover each slot. In the case where there is no card adjacent the slot, a bracket closes the slot to minimize electro-magnetic interference (EMI) leakage from the chassis. The brackets also limit external debris from entering the chassis. In the case where there is a card adjacent the slot, the bracket includes appropriately positioned openings therein to accommodate the plugs attached to the cards. In this manner, the card plugs are accessible for external connection.

Various mounting brackets and filler plates have been proposed for use with expansion cards mounted adjacent slots in computer chassis. In U.S. Pat. No. 4,924,355, a personal computer includes a chassis having a plurality of expansion slots in which are mounted optional Input/Output (I/O) expansion cards. At least one first expansion card has a first bracket adapted for connection to a mounting fixture. In U.S. Pat. No. 5,317,483, a sheet metal support cage structure within a computer has an inturned side wall ledge portion and removably receives a spaced series of expansion cards. Extending along edge portions of the cards that face the ledge are sheet metal mounting brackets having outwardly bent end tab portions that overlie and engage the side wall ledge. U.S. Pat. No. 5,544,006 provides, in a computer chassis containing a substantially planar removable expansion card therein, the computer chassis having an opening therein allowing access to the expansion card, a plane of the expansion card substantially parallel with a plane of the opening, a support structure for the expansion card and a method of supporting the expansion card. U.S. Pat. No. 5,575,546 discloses an apparatus for the retention of computer expansion cards and filler panels. The apparatus includes a mount in the expansion card or filler panel having a first edge and a second edge, opposite the first edge, to position the expansion card or filler panel relative to a chassis. U.S. Pat. No. 5,781,414 is directed to a card stabilizer for stabilizing an expansion card inserted in a female edge connector.

A problem arises where a bracket and a low profile card are to be provided for both a low profile chassis and a high profile (standard) chassis. This is because the slots in a standard profile chassis tailgate are of a greater length than the slots in a low profile chassis. Thus, the standard bracket size provided for a standard profile chassis slot will not fit a low profile chassis slot, and a smaller bracket, sized for a low profile chassis slot, will not fit a standard profile chassis slot.

Therefore, what is needed is a bracket which is useable with a low profile card in either a high profile chassis or a low profile chassis.

SUMMARY

One embodiment, accordingly, provides a bracket which can be used with a low profile card in either a low profile chassis or a high profile chassis. To this end, a variable size bracket for covering multiple size openings includes a multi-portion bracket adjustable between a first bracket size and a second bracket size. The multi-portion bracket includes a first bracket portion and a second bracket portion. The second bracket portion is attached to the first bracket portion for extending the multi-portion bracket to the second bracket size, and for reducing the multi-portion bracket to the first bracket size.

A principal advantage of this embodiment is that the bracket is used with a low profile card in either a low profile computer chassis or a standard profile computer chassis.

DETAILED DESCRIPTION

Figure 1:
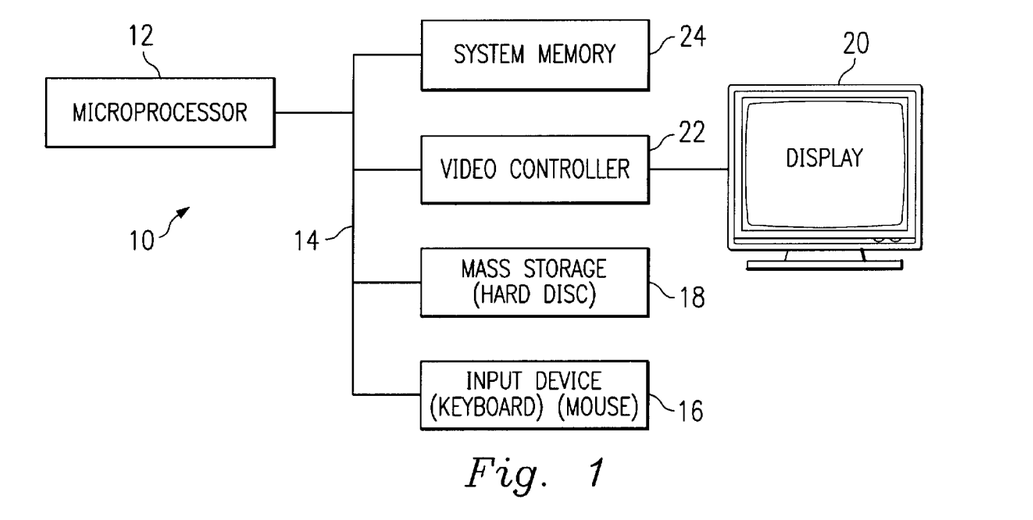
FIG. 1 is a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
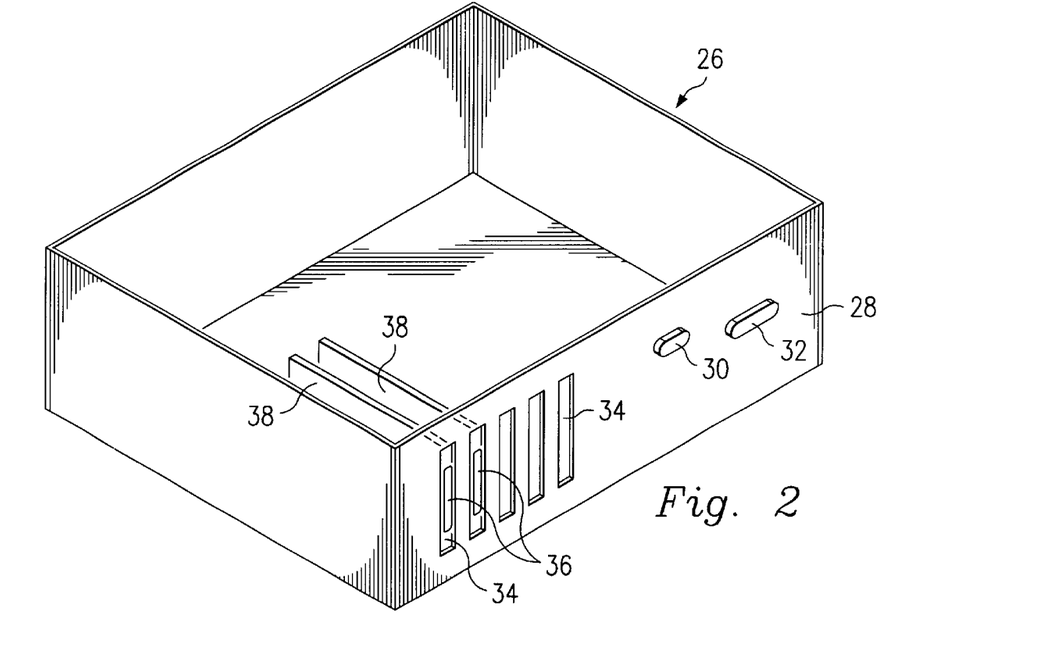
FIG. 2 is an isometric view illustrating an embodiment of a computer chassis.

In FIG. 2 a chassis base 26 of system 10 is provided. Chassis 26 includes a rear wall or tailgate 28 which is the I/O wall of the chassis 26. Tailgate 28 includes several I/O plugs 30, 32 and a plurality of slots 34 formed therein which provide access for a plug 36 attached to a communication card 38 mounted in chassis 26. A plurality of cards 38 may be mounted side-by-side in chassis 26 and their plugs 36 are accessible in their respective slots 34.

Figures 3, 6:
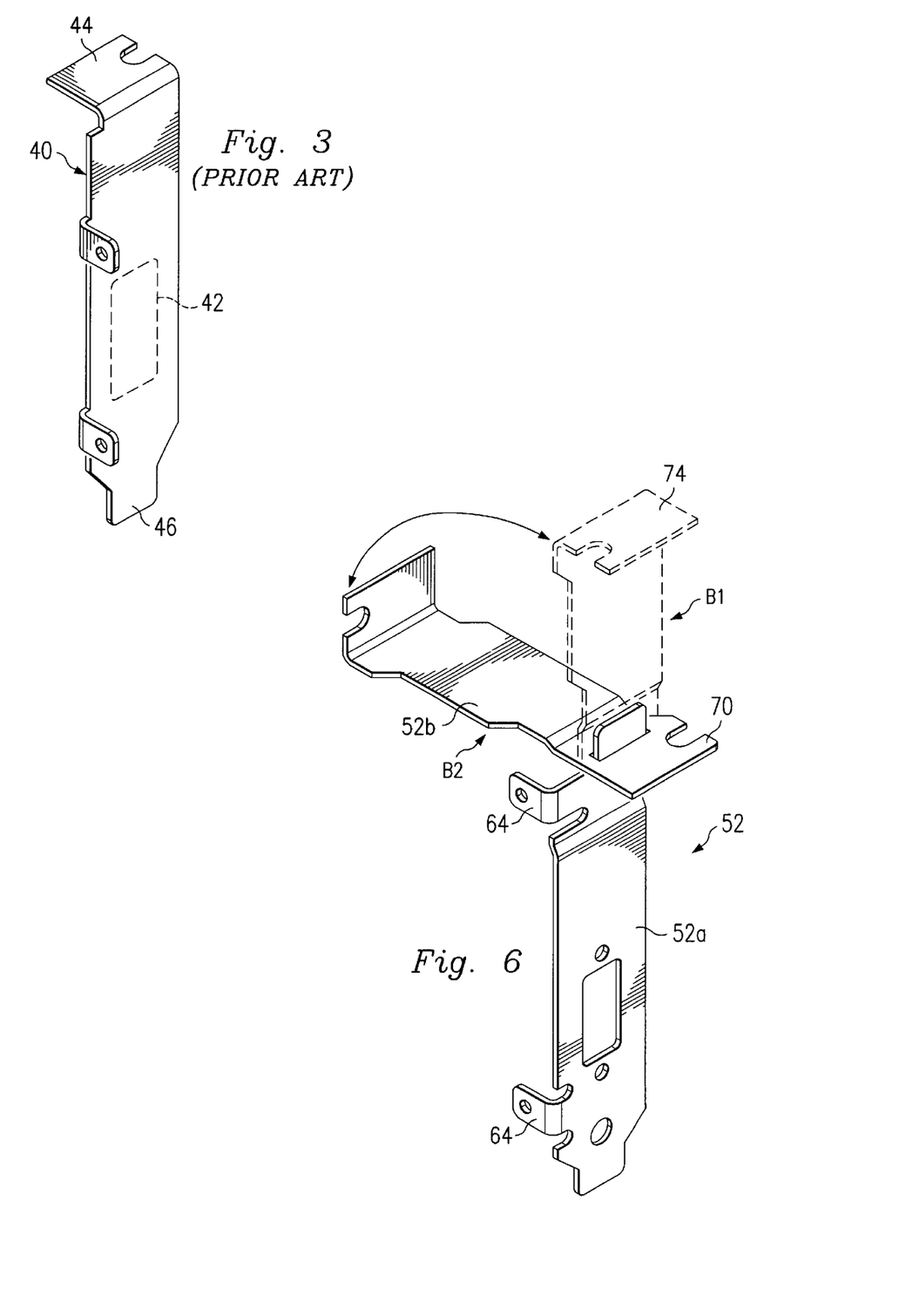
FIG. 3 is an isometric view illustrating a prior art bracket.
FIGS. 6 and 7 are perspective views of the bracket of FIGS. 5A–5C.

A well-known bracket 40 FIG. 3, is used to attach and stabilize the card 38 and plug 36 at the slot 34, as discussed above. As a result, the bracket 40 has a punch-out opening 42 formed therein so that the plug 36 is accessible to slot 34. In the instances where there is no card 38 adjacent the slot 34, bracket 40 is provided without an opening 42 to close the slot 34 to minimize EMI leakage from the chassis and to minimize external debris from entering the chassis. The bracket 40 includes an attachment flange 44 at a first end having a notch 45 for securing the bracket to the tailgate 28 by means of a threaded fastener, or the like, not shown. A tab 46 may be provided for securing a second end of bracket 40 to the tailgate 28.

Figure 4A:
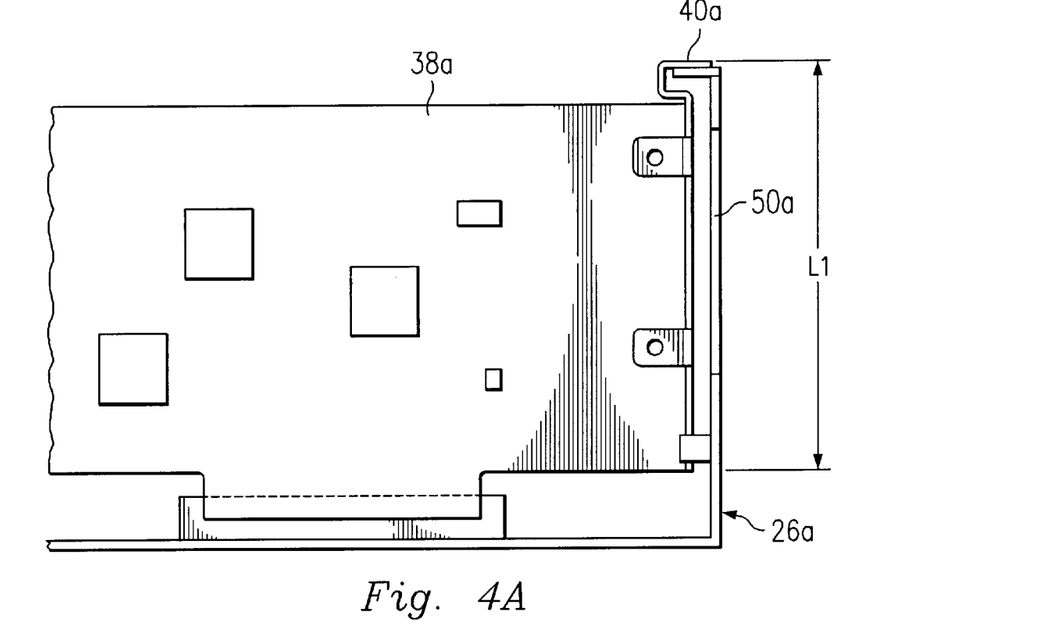
FIG. 4A is a side view illustrating a high profile card mounted in a chassis.
Figure 4B:
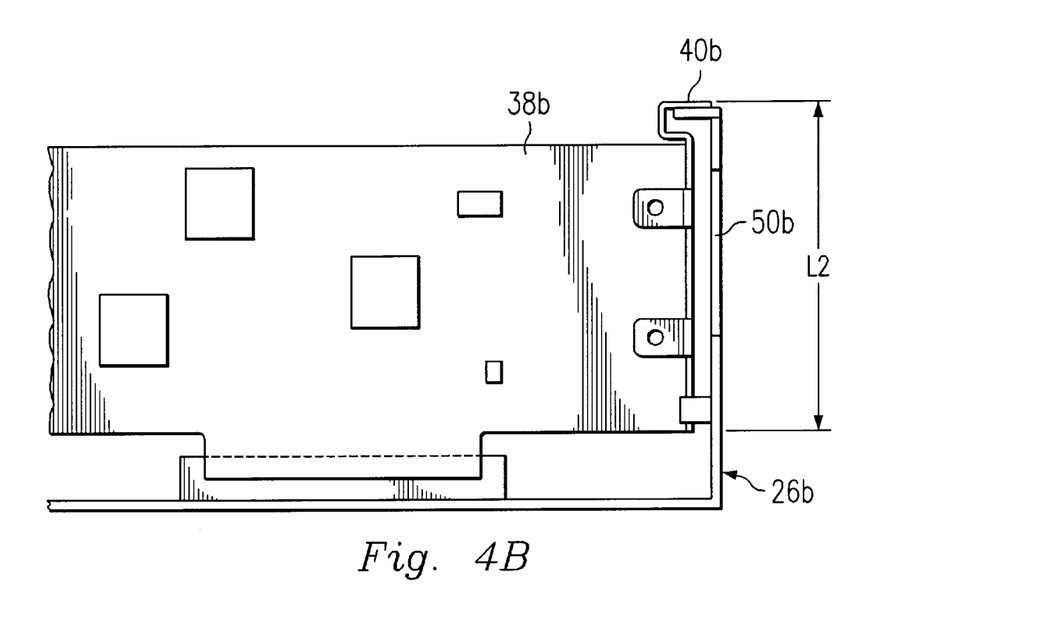
FIG. 4B is a side view illustrating a low profile card mounted in a chassis.

Brackets are used with a high profile card 38a, FIG. 4A, and with a low profile card, FIG. 4B. When a high profile card is used, a bracket 40a of a first length L1 is used to match the size of the high profile card 38a and also to cover the slot 50a of a high profile or standard chassis 26a. Thus, a bracket 40b, FIG. 4B used with a low profile card 38b in a low profile chassis 26b is of a second length L2, less than the first length L1, to match the size of the low profile card 38b and also to cover the slot 50b of low profile chassis 26b. A problem arises when a bracket and a low profile card are to be used for both a low profile chassis and a high profile chassis.

Figure 5A:
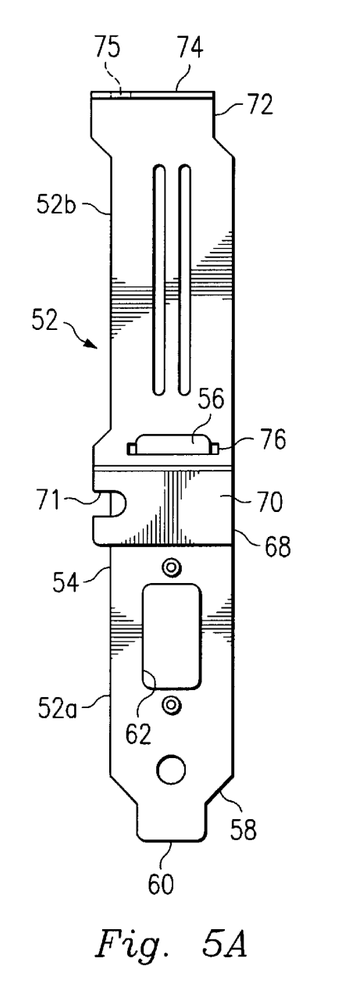
FIGS. 5A–5C are elevational views illustrating an embodiment of a variable size bracket.
Figure 5B:
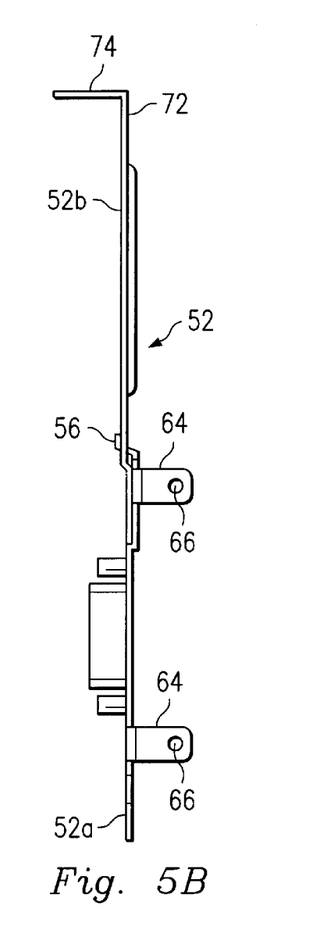
Figure 5C:
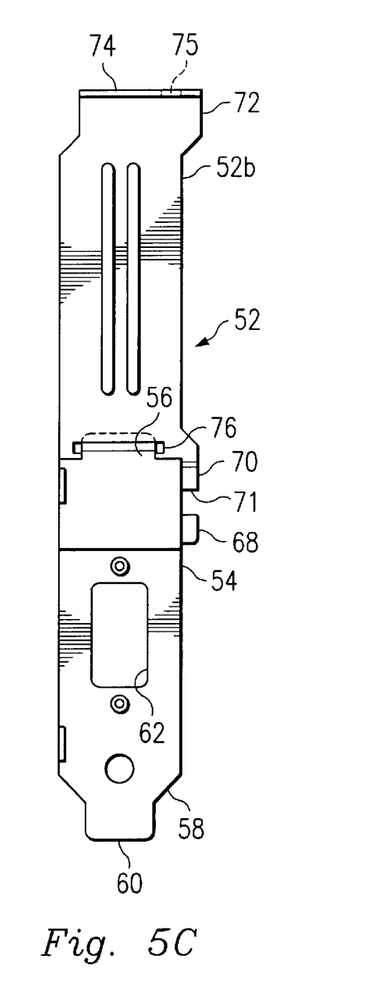

According to one embodiment, FIGS. 5A, 5B and 5C, a variable size bracket 52, is provided for covering multiple size openings. Bracket 52 is a multi-portion bracket including a first portion 52a and a second portion 52b. The bracket 52 is adjustable between a first bracket size and a second bracket size, discussed below. The first portion 52a includes a first end 54 having a bent tab 56, and a second end 58 having a straight tab 60. An opening 62 may be provided for the location of a card plug as described above. Also, a pair of card flanges 64 extend substantially at a right angle from first portion 52a. Flanges 64 have fastener apertures 66 provided therein for attaching a card (not shown) to the first portion 52a.

The second portion 52b includes a first end 68 having a first attachment flange 70, and a second end 72 having a second attachment flange 74. First end 68 also includes a slot 76 formed therein for receiving bent tab 56. Each attachment flange 70 and 74 includes a notch 71 and 75, respectively, for securing the bracket 52 to the chassis tailgate as described above. The connection between bent tab 56 and slot 76 provides a pivotal interconnection between the first portion 52a and the second portion 52b of bracket 52, see also FIG. 6. The pivotal interconnection can also be accomplished by means of a rolled hinge or the like.

Figure 7:
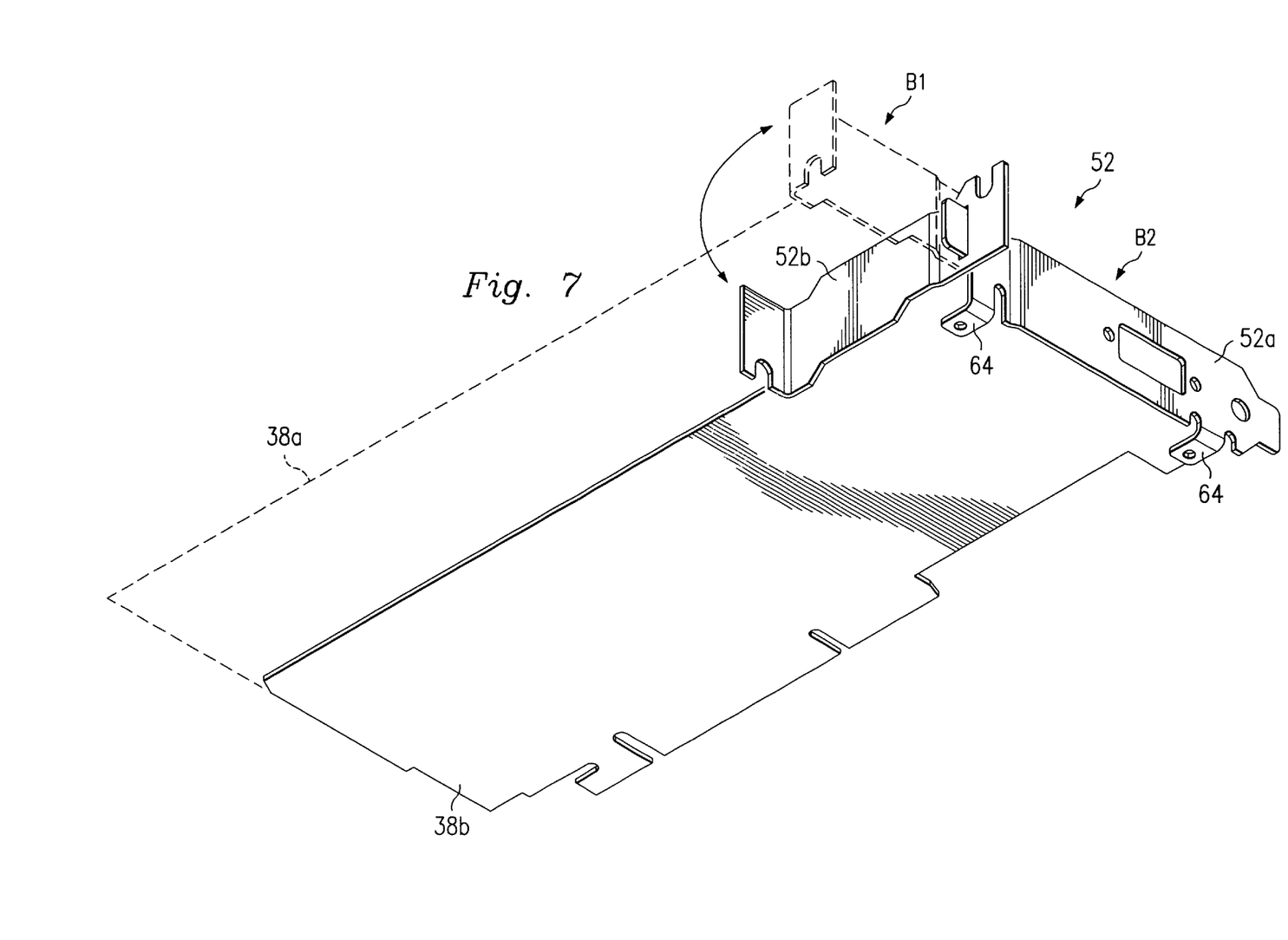
Figure 8A:
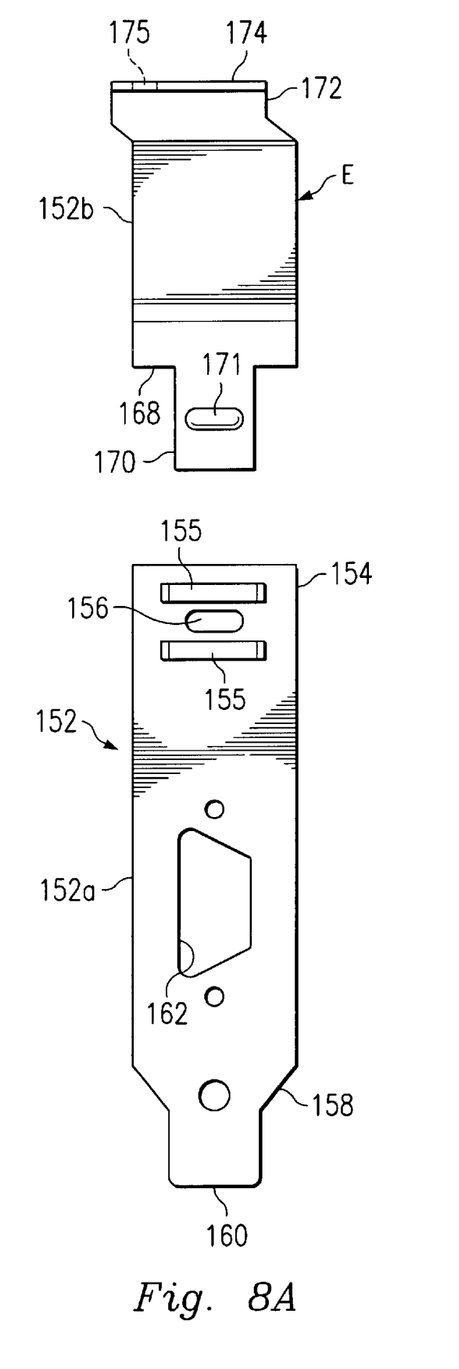
FIGS. 8A and 8B are elevational views illustrating another embodiment of a variable size bracket.
Figure 8B:
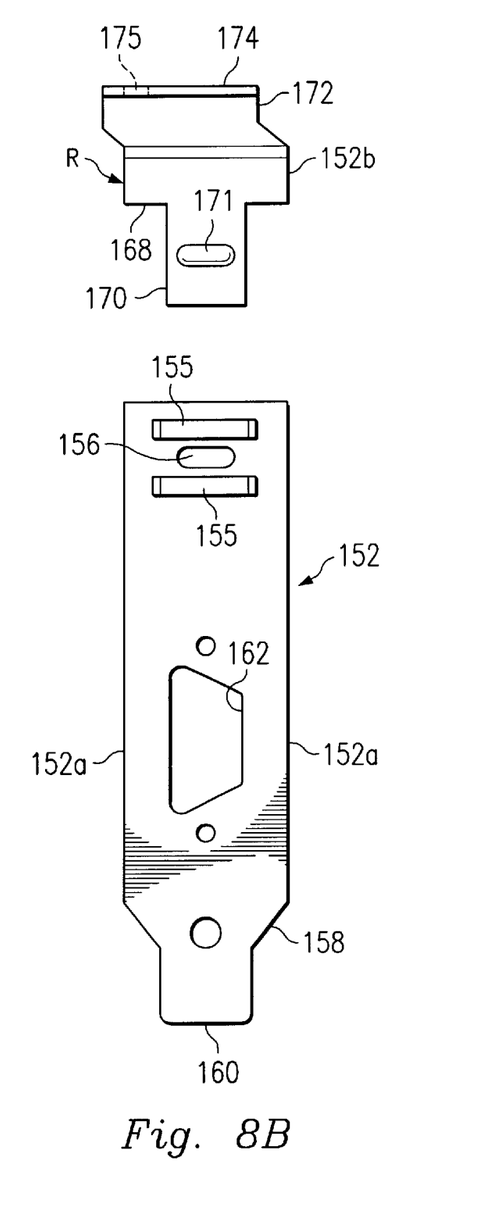
Figure 9:
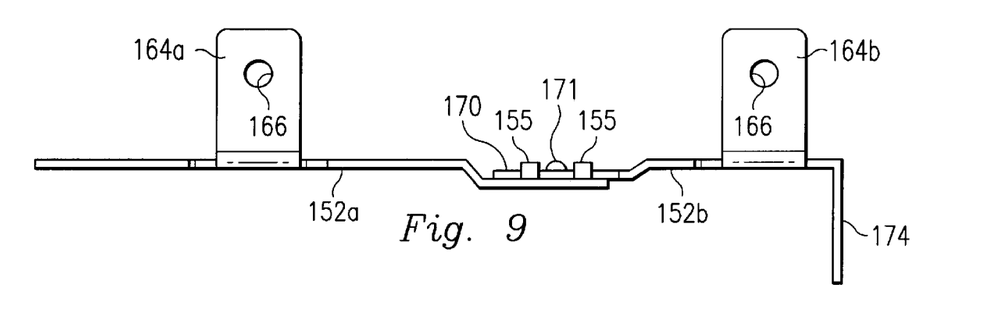
FIGS. 9 and 10 are further views of the bracket of FIGS. 8A–8B.
Figure 10:
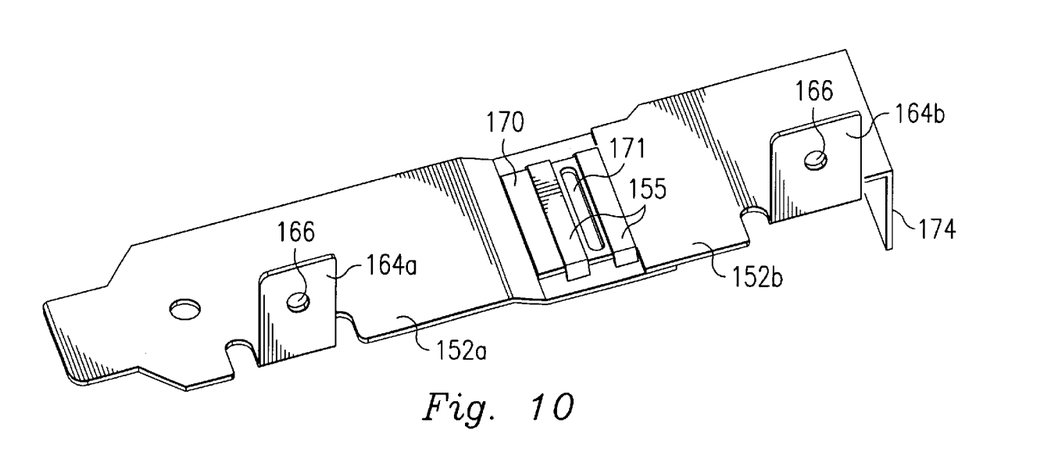

Bracket 52 may be used as illustrated in FIGS. 6 and 7 such that second bracket portion 52b extends the bracket 52 to an extended bracket size B1. In this configuration, the first attachment flange 74 is positioned to attach to the chassis tailgate as described above. Bracket 52 may also be used as illustrated such that the second bracket portion 52b is pivoted at about 90° relative to first bracket portion 52a, from the extended bracket size B1 to a reduced bracket size B2. In the pivoted configuration, the second attachment flange 70 is positioned to attach to the chassis tailgate as described above. As a result, it can be seen in FIG. 7, that when bracket 52 is configured in the extended bracket size B1, the high profile card 38a may be attached thereto. However, when bracket 52 is configured in the reduced bracket size B2, the low profile card 38b may be attached thereto. Either card 38a or 38b is attached to bracket 52 at the card flanges 64 as described above.

According to another embodiment, FIGS. 8A, 8B, 9 and 10, a variable size bracket 152, is provided for covering multiple size openings. Bracket 152 is a multi-portion bracket including a first portion 152a and a second portion 152b. The bracket 152 is adjustable between a first bracket size and a second bracket size, discussed below. The first portion 152a includes a first end 154 having a pair of spaced apart raised slots 155 and a detent 156 between the slots 155, and a second end 158 having a tab 160. An opening 162 may be provided for the location of a card plug as described above. Also, a card flange 164a extends substantially at a right angle from first portion 152a. Flange 164a has a fastener aperture 166 provided therein for attaching a card (not shown) as described above.

The second portion 152b may be in an extended form E, or a reduced form R. Second portion 152b includes a first end 168 having a tab 170 for sliding insertion through the raised slots 155 of first portion 152a, and a detent 171 for snap-in mated contact with detent 156 of first portion 152a. Second portion 152b also has a second end 172 including an attachment flange 174 having a slot 175 formed therein. Also, a card flange 164b extends substantially at a right angle from second portion 152b. Flange 164b has a fastener aperture 166 provided therein for attaching a card (not shown) as described above. It would be possible to include two card flanges on first portion 152a if desired. Also, because length is substantially the only difference between the extended and reduced forms E and R, respectively, of second portion 152b, the description above will suffice for either form.

When the extended form E of second portion 152b is attached to the first portion 152a, bracket 152 is in an extended bracket size to accommodate a high profile card as discussed above. When the reduced form R of second portion 152b is attached to first portion 152a, bracket 152 is in a reduced bracket size to accommodate a low profile card as described above.

As a result, one embodiment provides a variable size bracket for covering multiple size openings including a multi-portion bracket which is adjustable between a first bracket size and a second bracket size. The multi-portion bracket includes a first bracket portion and a second bracket portion. The second bracket portion is attached to the first bracket portion for extending the multi-portion bracket to the second bracket size, and also for reducing the multi-portion bracket to the first bracket size.

Another embodiment provides the above-described variable size bracket for use in a computer chassis which includes a plurality of card slots formed therein, the computer chassis being part of a computer system including a microprocessor mounted in the chassis, an input coupled to provide input to the microprocessor, a mass storage coupled to the microprocessor, a display coupled to the microprocessor by a video controller, and a memory coupled to provide storage to facilitate execution of computer programs by the microprocessor.

A further embodiment provides the above-described variable size bracket for use with a low profile card connected to the first bracket portion. The bracket can be extended to the second bracket size for use in a standard profile chassis, or can be reduced to the first bracket size for use in a low profile chassis.

As it can be seen, the principal advantages of these embodiments are that the bracket may be used with a low profile card in either a low profile computer chassis or a standard profile computer chassis. The bracket may be a hinged bracket or a multi-part bracket. The single adjustable bracket reduces the number of SKUs (tracking numbers) that must be managed by a manufacturer. Also, the adjustable bracket can be used in multiple chassis and multiple platforms. Overall, the adjustable bracket reduces manufacturing complexity and inventory which results in decreased costs.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A variable size bracket for covering multiple size circuit card slots in a computer chassis comprising:
   a multi-portion bracket linearly extendible between a first bracket length and a second bracket length;
   a first bracket portion being of the first bracket length sufficient to cover a first opening for use with a low profile circuit card; and
   a second bracket portion attached to the first bracket portion for:
      a) extending the first bracket portion to the second bracket length greater than the first bracket length; and
      b) the second bracket length being sufficient to cover a second opening for use with a high profile circuit card.

2. The bracket as defined in claim 1 wherein the first bracket portion and second bracket portion are pivotally interconnected.

3. The bracket as defined in claim 2 wherein the first bracket portion includes an attachment tab and the second bracket portion includes a slot, the attachment tab being movably engaged with the slot.

4. The bracket as defined in claim 3 wherein the second bracket portion includes a first end and a second end, the first end including the slot and an attachment flange, the second end including another attachment flange.

5. The bracket as defined in claim 2 wherein the second bracket portion includes opposed ends, each end having an attachment flange.

6. The bracket as defined in claim 5 wherein the first bracket portion includes opposed ends, each end having an attachment tab.

7. The bracket as defined in claim 6 wherein the second bracket portion includes a slot formed at one end, one of the attachment tabs being pivotally engaged with the slot.

8. The bracket as defined in claim 2 wherein the second bracket portion is movable between a first position and a second position, the second bracket portion including opposite ends, each end including an attachment flange, so that one of the attachment flanges is in an attachment mode when the second bracket portion is in either of the first and second positions.

9. The bracket as defined in claim 1 wherein the first bracket portion and the second bracket portion are engaged by a sliding tab and slot interconnection.

10. The bracket as defined in claim 9 wherein the second bracket portion includes a tab and the first bracket portion includes a slot for receiving the tab.

11. The bracket as defined by claim 10 wherein the first and second bracket portions each include a mating detent respectively adjacent the tab and the slot.

12. The bracket as defined in claim 9 wherein the second bracket portion includes a tab and the first bracket portion includes a pair of aligned slots for receiving the tab.

13. The bracket as defined in claim 1 wherein the first bracket portion and the second bracket portion are engaged by a snap-in interconnection.

14. The bracket as defined in claim 13 wherein the first bracket portion includes a first detent and the second bracket portion includes a second detent for mated engagement with the first detent.

15. A computer system comprising:
   a chassis;
   a microprocessor mounted in the chassis;
   an input coupled to provide input to the microprocessor;
   a mass storage coupled to the microprocessor;
   a display coupled to a video controller;
   a memory coupled to provide storage to facilitate execution of computer programs by the microprocessor;
   the chassis including a plurality of card slots formed therein;
   a multi-portion bracket linearly extendible between a first bracket length and a second bracket length, the multi-portion bracket including a first bracket portion of the first bracket length for covering a first opening for use with a low profile circuit card; and
   a second bracket portion attached to the first bracket portion for:
      a) extending the first bracket portion to the second bracket length greater than the first bracket length; and
      b) the second bracket length being sufficient to cover a second opening for use with a high profile circuit card.

16. The system as defined in claim 15 wherein the first bracket portion and the second bracket portion are pivotally interconnected.

17. The system as defined in claim 16 wherein the first bracket portion includes an attachment tab and the second bracket portion includes a slot, the attachment tab being movably engaged with the slot.

18. The system as defined in claim 17 wherein the second bracket portion includes opposed ends, each end having an attachment flange.

19. The system as defined in claim 16 wherein the second bracket portion is movable between a first position and a second position, the second bracket portion including opposite ends, each end including an attachment flange, so that one of the attachment flanges is in an attachment mode when the second bracket portion is in either of the first and second positions.

20. The system as defined in claim 15 wherein the first bracket portion and the second bracket portion are engaged by a sliding tab and a slot interconnection.

21. The system as defined in claim 15 wherein the first bracket portion and the second bracket portion are engaged by a snap-in interconnection.

22. A variable size bracket for a low profile card comprising:
   a multi-portion bracket linearly extendible between a first bracket length and a second bracket length;
   a first bracket portion being of the first bracket length sufficient to cover a first opening for use with a low profile circuit card;
   the low profile card connected to the first bracket portion; and a second bracket portion attached to the first bracket portion for:
  a) extending the first bracket portion to the second bracket length greater than the first bracket length; and
  b) the second bracket length being sufficient to cover a second opening for use with a high profile circuit card.

* * * * *